(12) United States Patent
Bell

(10) Patent No.: US 7,451,905 B2
(45) Date of Patent: Nov. 18, 2008

(54) WIRE BONDING WEDGE

(75) Inventor: Russell K. Bell, Camarillo, CA (US)

(73) Assignee: Edwards Enterprises, Golden, CO (US)

( * ) Notice: Subject to any disclaimer, the term of this patent is extended or adjusted under 35 U.S.C. 154(b) by 52 days.

(21) Appl. No.: 10/710,139

(22) Filed: Jun. 22, 2004

(65) Prior Publication Data

US 2005/0279811 A1    Dec. 22, 2005

(51) Int. Cl.
  *B23K 1/06*   (2006.01)
  *B23K 37/00*  (2006.01)
(52) U.S. Cl. .......................................... 228/1.1; 228/4.5
(58) Field of Classification Search .............. 228/180.5, 228/4.5, 1.1
  See application file for complete search history.

(56) References Cited

U.S. PATENT DOCUMENTS

| | | | | |
|---|---|---|---|---|
| 3,689,983 A | * | 9/1972 | Eltzroth et al. | 228/180.5 |
| 3,690,538 A | * | 9/1972 | Gaiser et al. | 228/1.1 |
| 3,718,272 A | * | 2/1973 | Eltzroth et al. | 228/3.1 |
| 3,971,499 A | * | 7/1976 | Goodrich et al. | 228/54 |
| 4,202,482 A | * | 5/1980 | Sade et al. | 228/4.5 |
| 5,018,658 A | * | 5/1991 | Farassat | 228/4.5 |
| 5,558,270 A | * | 9/1996 | Nachon et al. | 228/180.5 |
| 5,836,071 A | * | 11/1998 | Falcone et al. | 29/593 |
| 6,667,625 B1 | * | 12/2003 | Miller | 324/525 |
| 2003/0075804 A1 | * | 4/2003 | Glexiner et al. | 257/762 |
| 2003/0205827 A1 | * | 11/2003 | Glexiner et al. | 257/784 |

* cited by examiner

*Primary Examiner*—Kiley Stoner
(74) *Attorney, Agent, or Firm*—Townsend and Townsend and Crew LLP

(57) ABSTRACT

This invention is for a wedge for bonding an elongated conductor, such as a wire, to a bond pad on a microelectronic device. A wire passes through an aperture in the wedge into a pocket or an open notch. A sidewall on each side of the pocket or open notch prevents the wire from moving sideways. The wire passes over a foot that extends below the sidewalls by an amount sufficient to prevent the sidewalls from contacting the surface of the microelectronic device during bonding. The wire is bonded to a bond pad on a microelectronic device by feeding the wire through the aperture of the wedge and over the foot, pressing said wire between the foot and the bond pad, and applying bonding energy, such as ultrasonic energy, to the wire.

19 Claims, 10 Drawing Sheets

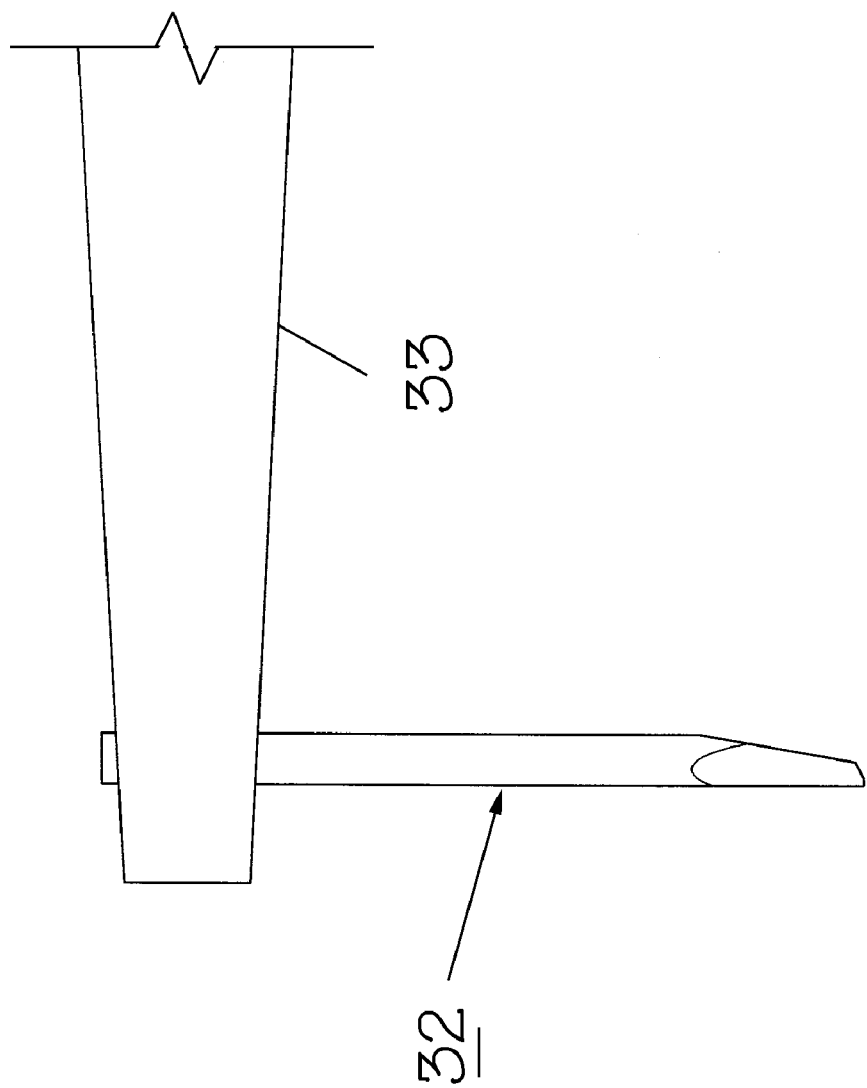

WIRE BONDING WEDGE

BACKGROUND OF INVENTION

This invention relates to a wedge for bonding wire to a bond pad. In particular, it relates to a wedge having an aperture through which a wire passes, sidewalls that constrain the sideways movement of the wire, and a dropped foot that presses the wire against a bond pad and bonds it to that bond pad.

A wedge is a tool for bonding wire to a bond pad, which is typically on a printed circuit board that will become part of a micro-electronic device. The bond may be made to a very small bond pad, recessed about 2 to 8 microns below a protective overcoat or passivation layer. The wire passes through an aperture in the wedge, then over a foot that is pressed against the bond pad. The foot bonds the wire to the bond pad, typically by means of ultrasonic vibrations. After a first bond has been made, the wedge is moved to a second bond pad, where a second bond is made, and then the wire is cut off. The first bond and second bond may not be in-line with one another, but at an angle or diagonally spaced.

Two types of wedges are now in use commercially, the pocket type and the open notch type. FIG. 1 illustrates a prior art open notch type of wedge 1. Wire 2 passes through aperture 3 of wedge 1 into an open V-shaped notch 4, then over foot 5, which bonds it to a bond pad (not shown). When wire 2 passes through aperture 3 into open v-shaped notch 4, the absence of any side wall containment permits wire 2 to stray from side to side. This may happen due to wire memory or to the required bonding motions made by the wire bonding machine as it moves to different bonding positions. An off-center wire may lead to bonds that are off-center on the bond pad, or the wire may come out from under the foot of the wedge entirely so that no bond is made; if the wire is not beneath the foot, the foot may touch the bond pad and damage it when it attempts to form a bond.

FIG. 2 illustrates a prior art pocket type wedge 6. Wedge 6 has an aperture 7 through which wire 8 passes into pocket 9 formed by sidewalls 10. Wire 8 then moves under foot 11 which presses it against a bond pad (not shown) and forms a bond. Sidewalls 10 prevent wire 8 from moving side-to-side so that the wire is more centered on the foot than it is with the open notch wedge shown in FIG. 1 and the bond is more precisely positioned. However, the sidewalls of the pocket type may contact and damage surfaces on the microelectronic device, especially if the bond pad is slightly recessed, a problem that is avoided by the open notch design.

In FIG. 3, the pocket type of wedge of FIG. 2 is shown bonding wire 8 to recessed bond pad 12 of a microelectronic device 13. Because bond pad 12 is recessed, sidewalls 10 touch protective overcoat or passivation layer 14, which surrounds bond pad 12, causing cracking or other damage to overcoat or passivation layer 14. Additionally, in the current pocket type design, the back radius 15 of foot 11 cannot extend across the entire width of the wedge (see FIG. 2), causing a compromised radius geometry and an imperfect radius impression in the bonded wire, as well as difficulty in physically measuring back radius 15 on wedge 6 without destructive cross-sectioning.

Unlike the prior art pocket type of wedge, the prior art open notch type of wedge bonds wire to a recessed pad area without damaging the surrounding protective overcoat or passivation. The open notch design also has a uniform radius at the back of the foot across the entire width of the wedge, thereby making a uniform impression in the bonded wire and permitting the back radius to be measured easily and accurately. A uniform impression in the wire is beneficial for consistent wire bonding performance. However, as hereinabove pointed out, the prior art open notch type of wedge does not center the wire over the bond pad as well as the pocket type of wedge.

SUMMARY OF INVENTION

In accordance with the present invention, the above-noted deficiencies in the prior art wedges are minimized or eliminated. The wedges of this invention bond wire to recessed bond pads while keeping the wire centered over the bond pad, without damaging the overcoat or passivation layer of a microelectronic device.

This highly desirable result is accomplished because the foot of a wedge according to this invention is dropped below the level of the sidewalls by an amount sufficient to prevent the sidewalls from contacting the overcoat or passivation layer. But because sidewalls are still present, the wire is still centered over the bond pad.

BRIEF DESCRIPTION OF DRAWINGS

FIG. 6 is a side view of a wedge according to this invention held by a wire bonding machine.

DETAILED DESCRIPTION

Figure 4A:
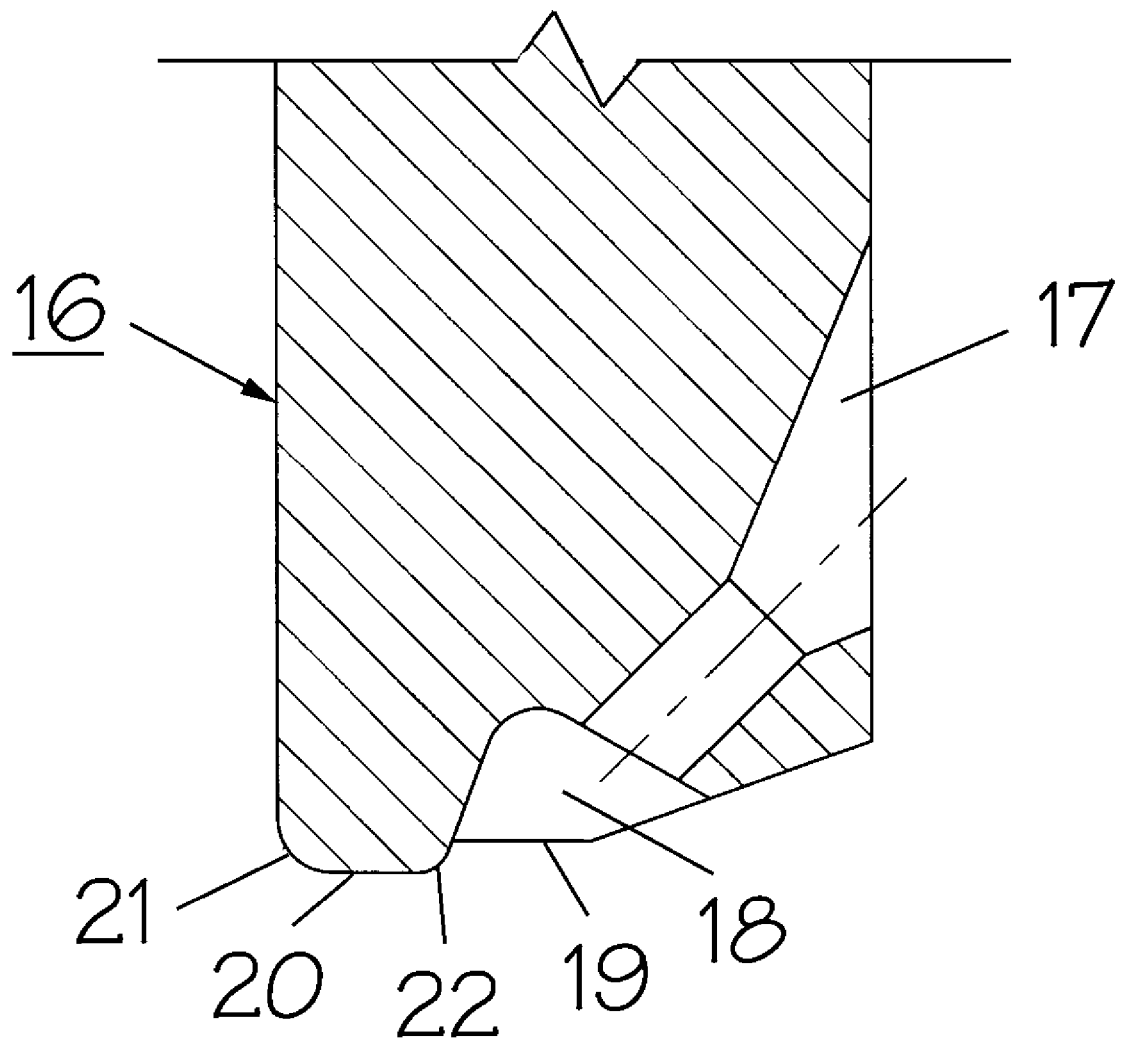
FIGS. 4a, 4b, and 4c are a side view in section, a rear view, and a bottom view, respectively, of a certain presently preferred embodiment of an open notch type of wedge according to this invention.
Figure 4B:
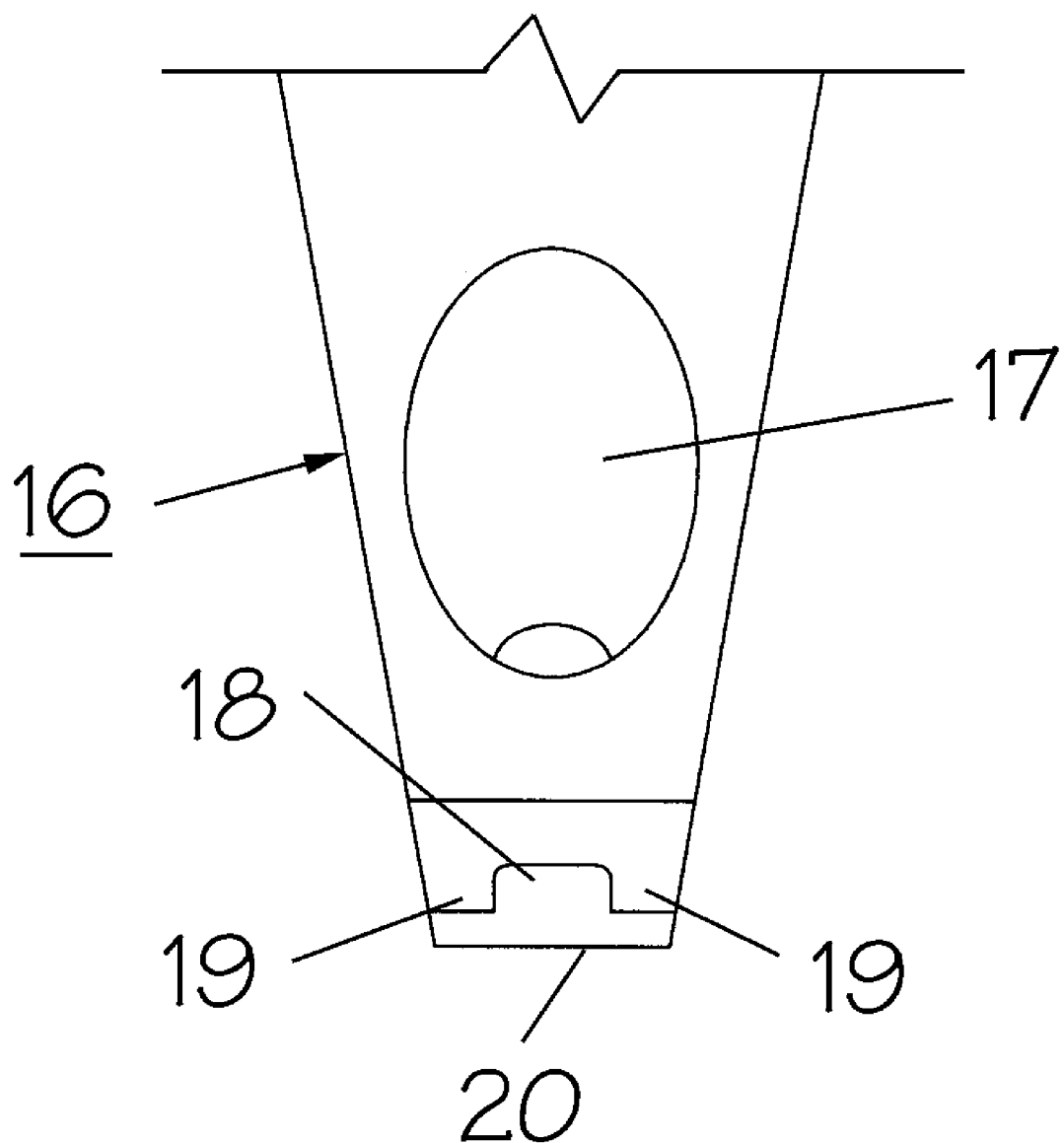
Figure 4C:
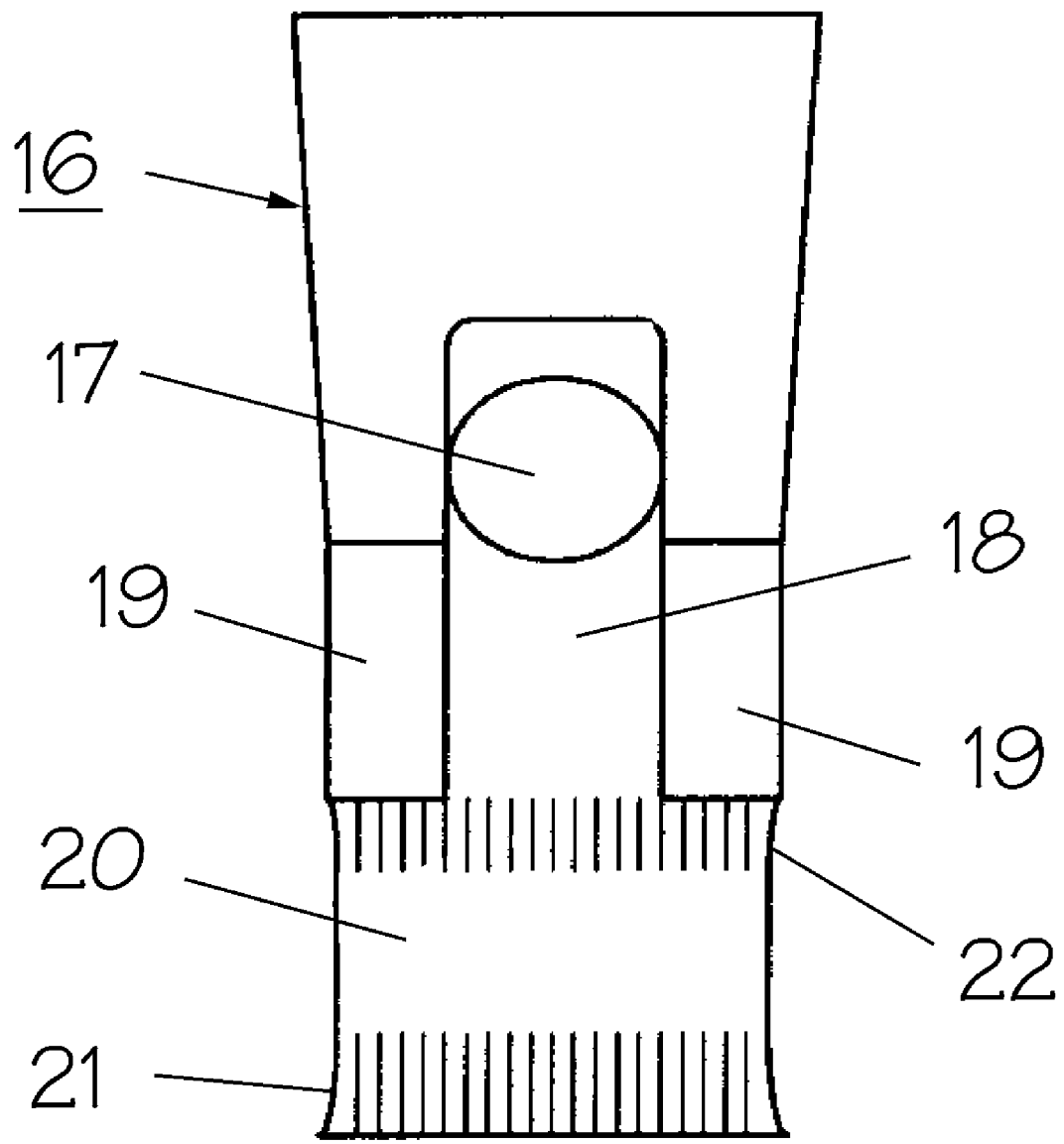

In FIGS. 4a, 4b, and 4c, open notch type wedge 16 has an opening 17 through which a wire (not shown) may be threaded. At one end of opening 17 is a V-shaped notch 18 with sidewalls 19 on each side. During the wire bonding process, the wire can be guided and contained by sidewalls 19. Foot 20 extends below the bottom of sidewalls 19 by an amount sufficient to prevent contact between sidewalls 19 and the surface of the microelectronic device. Typically, a distance of about 0.0003 to about 0.0010 inches between the bottom of sidewalls 19 and the bottom of foot 20 will be adequate to prevent sidewalls 19 from contacting the overcoat or passivation layer of the microelectronic device and damaging it, while still preventing the wire from moving side-to-side instead on being held in the center of foot 20 by sidewalls 19. Preferably, for best results, foot 20 extends about 0.0004 to about 0.0008 inches below sidewalls 19. Foot 20 has a curved front surface 21, which may have no radius (i.e., a sharp edge) or a radius that gives a rounded surface, such as a radius of about 50 to about 100% of the diameter of the wire; a smaller radius may cut the wire and a larger radius is unnecessary. Foot 20 also has a curved back surface 22, which may have a radius similar to that of front surface 21. The length of the foot between the two radii may be about 13 to about 150 microns. The width of foot 20 may be about 25 to about 150 microns.

Figure 1:
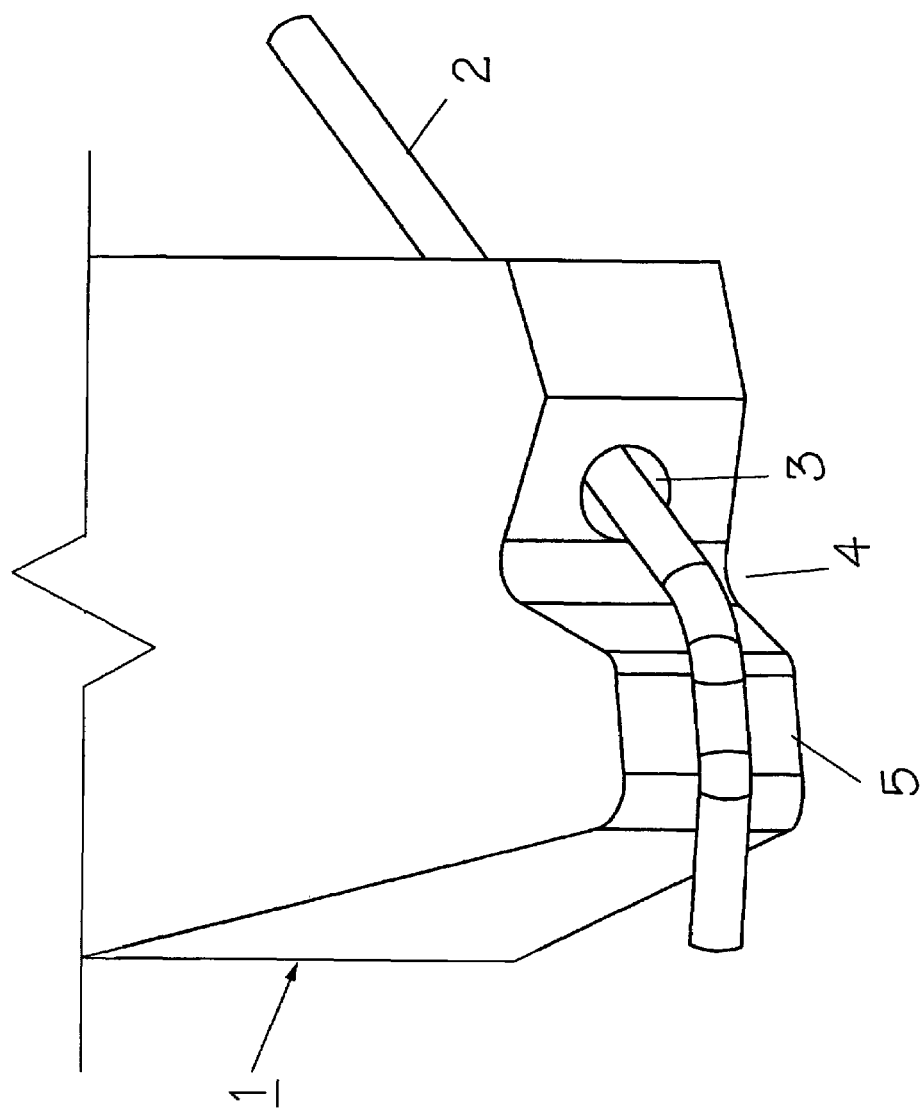
FIG. 1 is an isometric view of a typical prior art open notch type of wedge.
Figure 2:
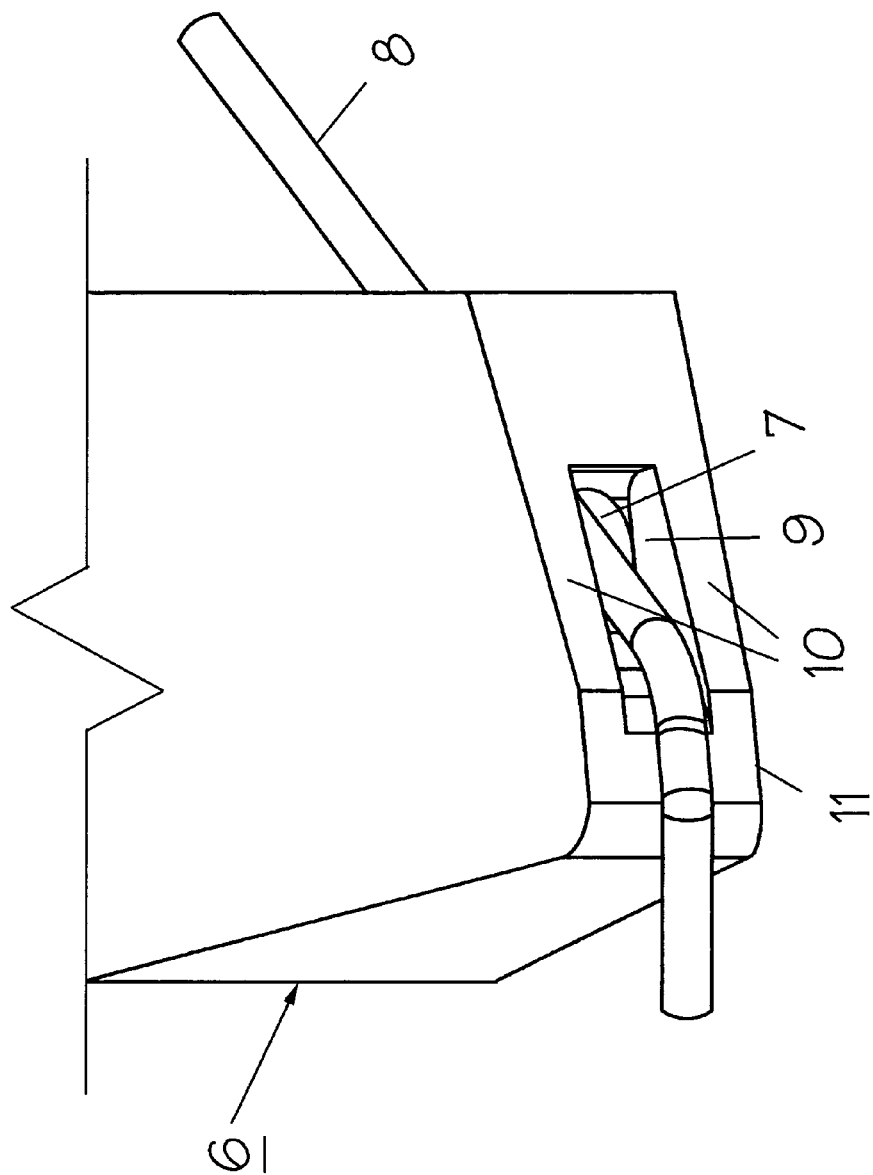
FIG. 2 is an isometric view of a typical prior art pocket type of wedge.
Figure 3:
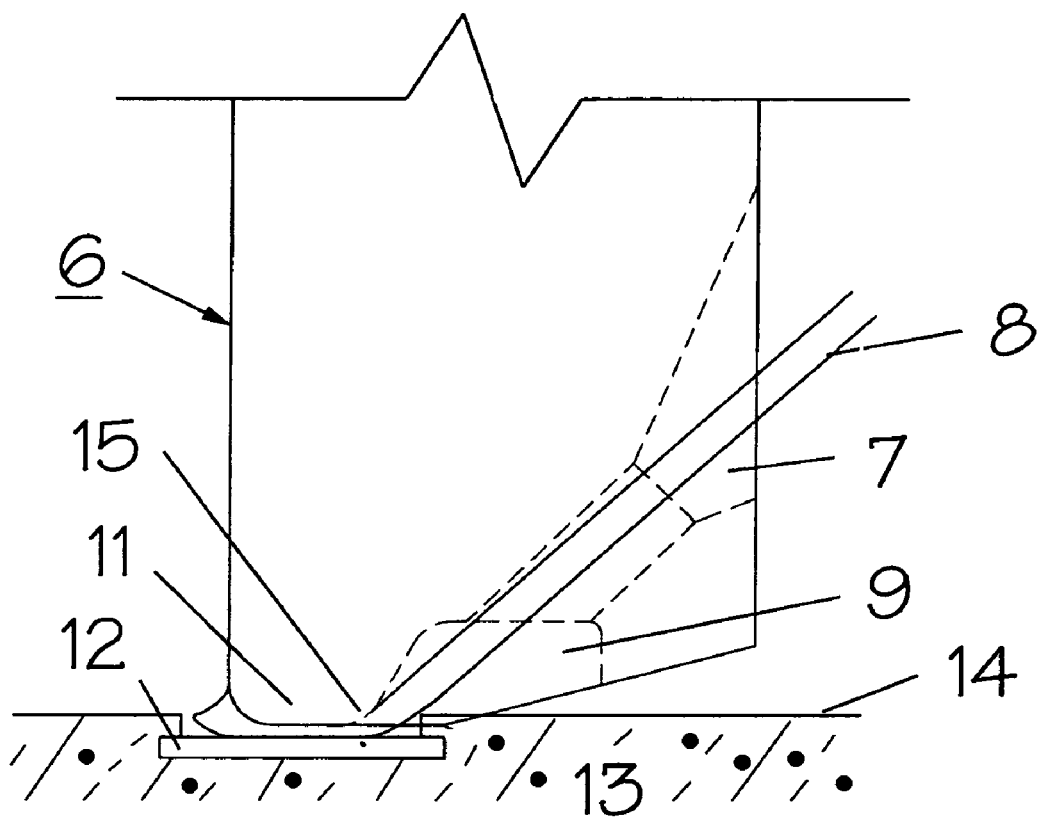
FIG. 3 is a side view of a prior art pocket type of wedge bonding a wire to a recessed bond pad.
Figure 5A:
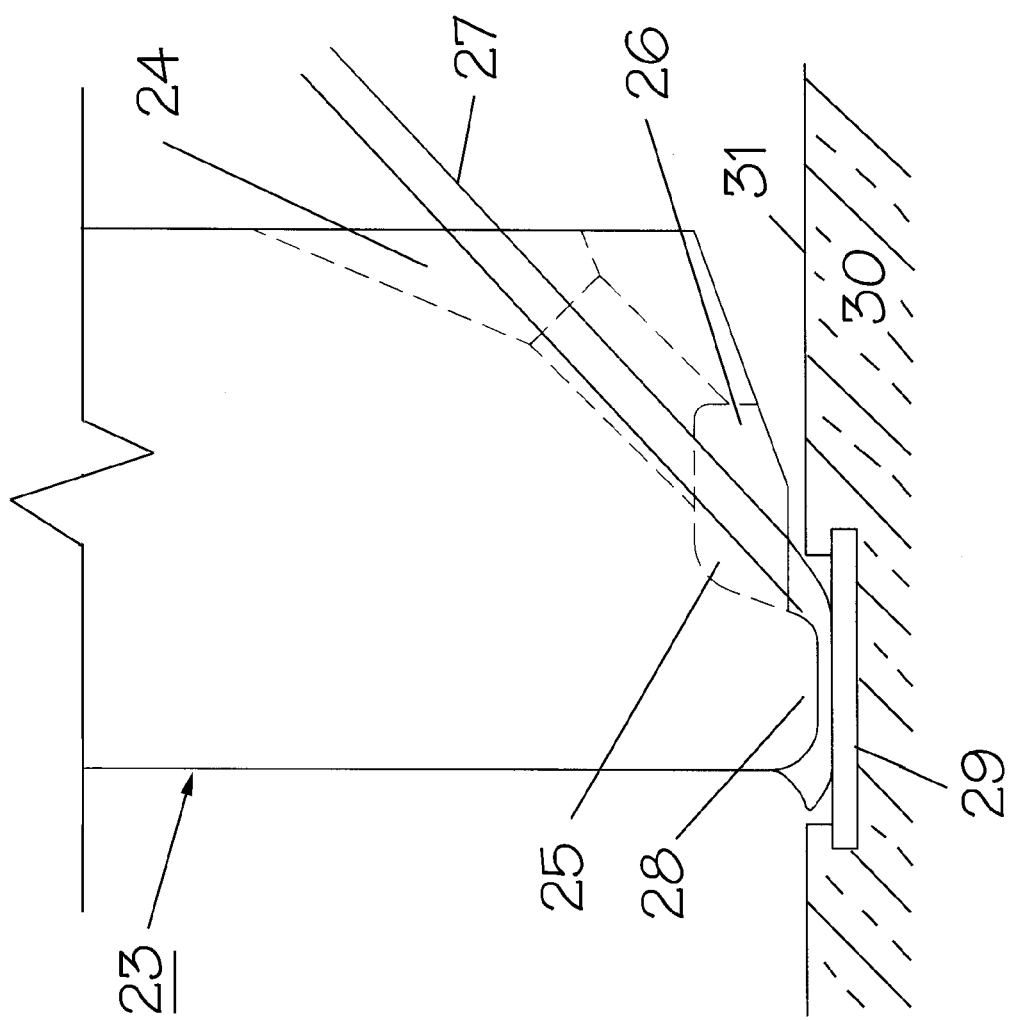
FIGS. 5a, 5b, and 5c are a side view, a rear view, and a bottom view, respectively, of a certain presently preferred embodiment of a pocket type of wedge according to this invention.
Figure 5B:
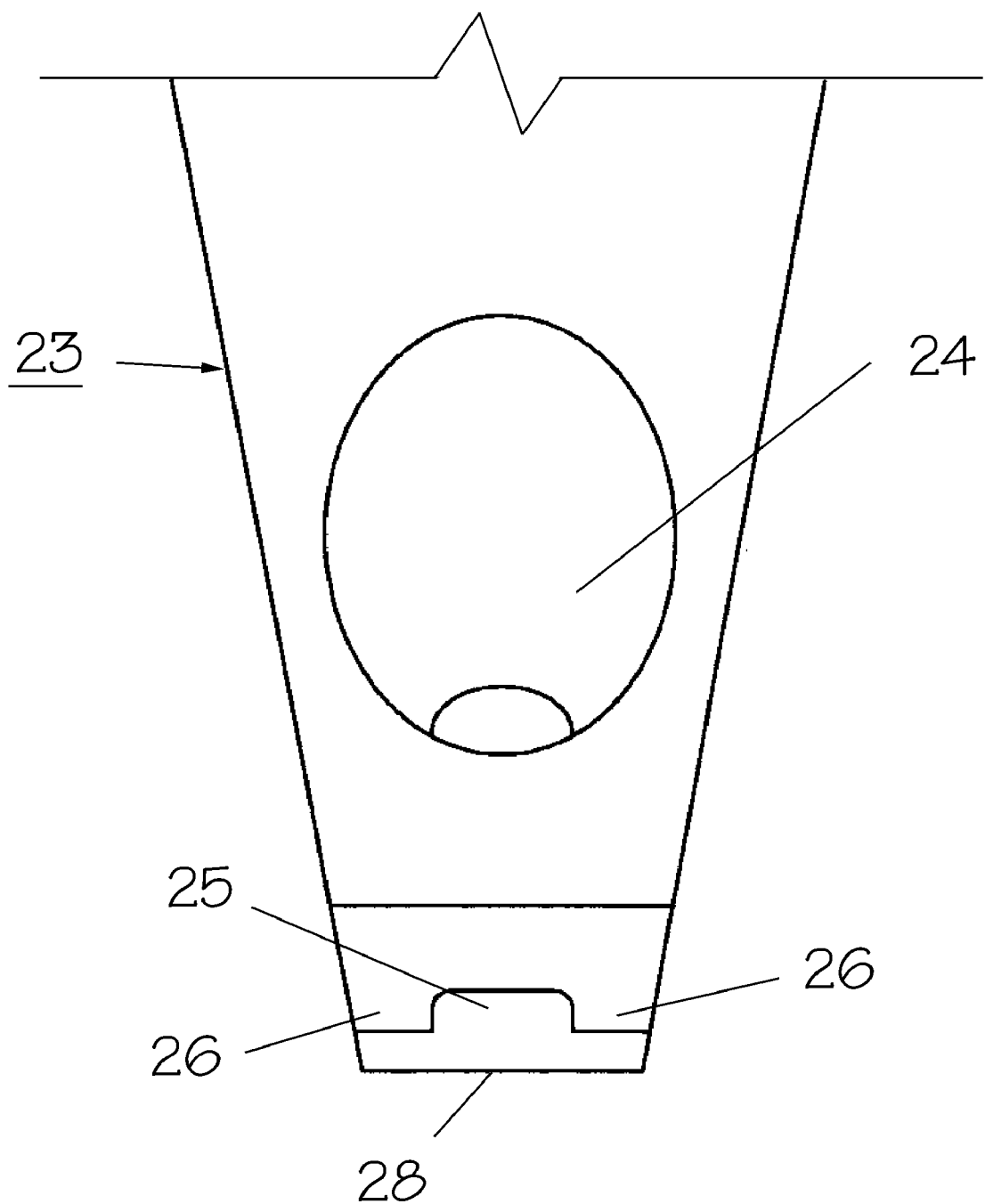
Figure 5C:
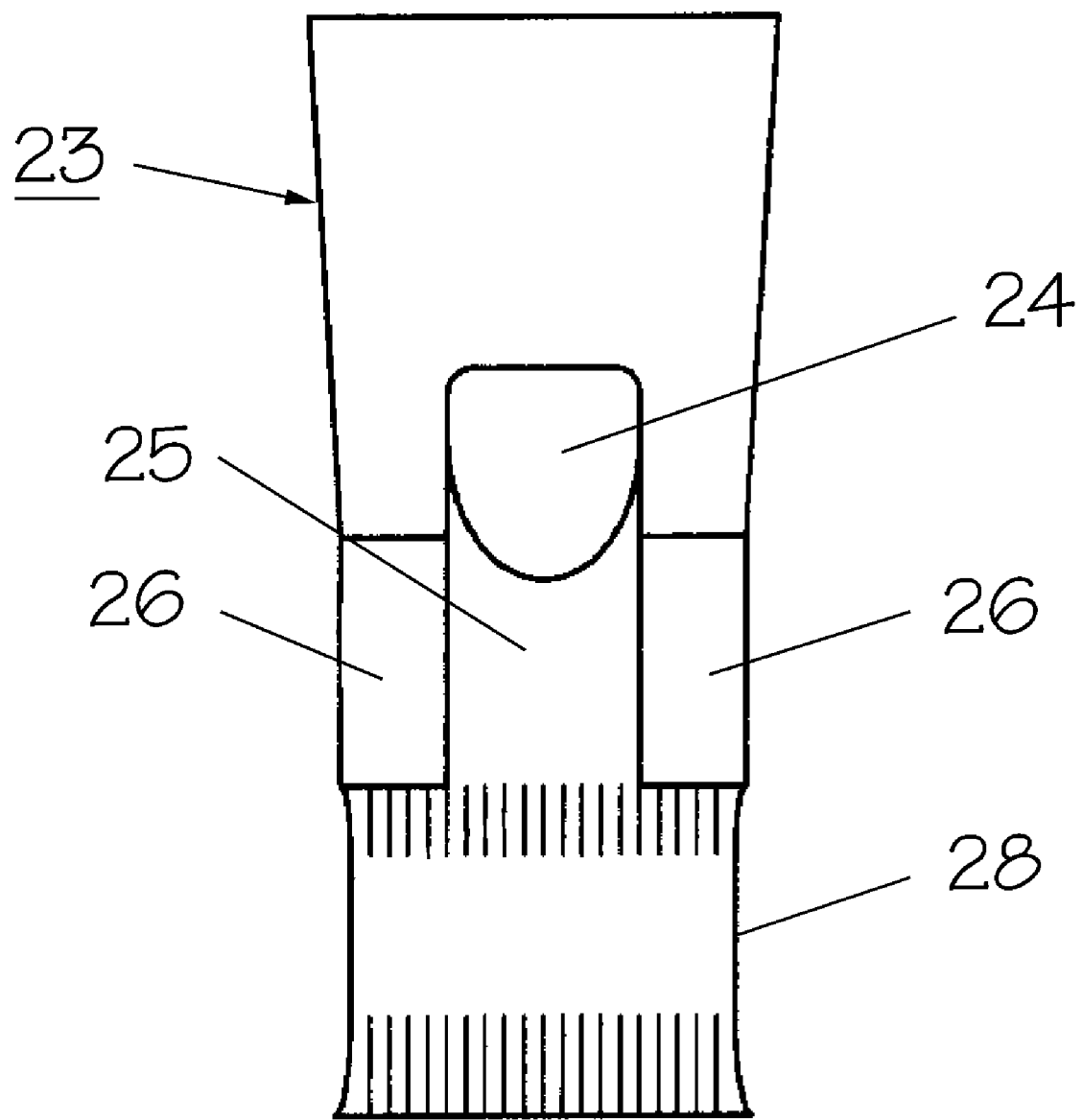

In FIGS. 5a, 5b, and 5c, pocket type wedge 23 has an opening 24. At one end of opening 24 is a pocket 25 in wedge 23, formed by sidewalls 26 on either side. Wire 27 passes through opening 24 and over foot 28, which extends below sidewalls 26, as described for FIGS. 4a, 4b, and 4c. Foot 28 bonds wire 27 to recessed bond pad 29 of microelectronic device 30 (FIG. 5a). Because foot 28 extends below sidewalls 26, sidewalls 26 do not damage the overcoat or passivation layer 31 of microelectronic device 30 during bonding, as may occur with the prior art pocket type wedge (see FIG. 3).

The wire bonding wedge of this invention may be made of tungsten carbide, titanium carbide, cermet, or other materials. The wedge may be made by grinding and electro-discharge machining, spark erosion or other techniques. It is used to bond wires, ribbons, or other elongated conductors to semiconductor and micro-electronics devices.

In FIG. 6, wedge 32, which may be a pocket typed wedge or an open notch type wedge according to this invention, is held by arm 33 of a wire bonding machine. The wire bonding machine moves wedge 32 from bond pad to bond pad as the wire is bonded to the bond pads. Ultrasonic, thermosonic, thermocompression energy or other type of energy may be used to effect the bond. The wire bonding machine may be manual, semi-automatic, or fully automatic. Wires or metal ribbons may be bonded and they may be made of gold, aluminum, copper, or other conductive, bondable materials. Depending on the semiconductor or micro-electronic device, such wires are typically on the order of 18 to 50 microns in diameter, and up to 500 microns in diameter for higher power devices. The bond may be from a metalized substrate, a die, or a semiconductor chip in a package or carrier, to a leadframe or land or from other semiconductor devices or components, or adjacent devices. The bond may be between two locations or between multiple locations.

The invention claimed is:

1. A wedge for bonding an elongated conductor to a bond pad that is recessed beneath the surface of a microelectronic device, said wedge comprising:
   (A) a body having an aperture, said aperture comprising:
      an entrance opening through which said elongated conductor enters the body; and
      an exit opening at which said elongated conductor exits the body;
   (B) a sidewall beneath each side of said exit opening to prevent said elongated conductor from moving sideways; and
   (C) a foot having a back radius that extends completely across a width of the wedge, where said foot extends beneath said sidewalls by an amount sufficient to prevent said sidewalls from contacting the surface of said microelectronic device during bonding.

2. A wedge according to claim 1 wherein said foot extends about 0.0003 to about 0.0010 inches beneath said sidewalls.

3. A wedge according to claim 1 wherein said wedge comprises tungsten carbide, titanium carbide, or cermet.

4. A wedge according to claim 1 wherein said elongated conductor comprises a wire.

5. A wedge according to claim 4 wherein said foot has a front radius of about 50 to about 100% of the diameter of said wire.

6. A wedge according to claim 4 wherein said back radius is about 50 to 100% of the diameter of said wire.

7. A wedge according to claim 1 wherein said foot has a front and back width of about 25 to about 150 microns.

8. A wedge according to claim 1 wherein said foot has a length of about 13 to about 150 microns.

9. A wedge according to claim 1 wherein said sidewalls at least partially define a pocket between themselves.

10. A wedge according to claim 1 wherein said sidewalls at least partially define an open notch between themselves.

11. A wedge according to claim 2 wherein said foot extends about 0.0004 to about 0.0008 inches beneath said sidewalls.

12. A wedge according to claim 1 wherein said bond pad is recessed about 2 to about 8 microns below the surface of said microelectronic device.

13. A wedge according to claim 1 wherein said elongated conductor comprises gold, aluminum, or copper.

14. A wedge according to claim 4 wherein said wire is about 18 to about 50 microns in diameter.

15. A wedge according to claim 1 including bonding means for applying bonding energy to said elongated conductor.

16. A pocket type wedge for bonding a wire to a bond pad that is recessed beneath the surface of a microelectronic device, said wedge comprising:
   (A) a body having an aperture, said aperture comprising:
      an entrance opening through which said wire enters the body; and
      an exit opening at which said wire exits the body;
   (B) a sidewall beneath each side of said exit opening to prevent said wire from moving sideways; and
   (C) a foot having a back radius that extends completely across a width of the wedge, where said foot extends about 0.0004 to about 0.0008 inches beneath said sidewalls, whereby no portion of said wedge contacts said surface during bonding.

17. A wedge according to claim 16 including ultrasonic bonding means for applying ultrasonic bonding energy to said wire.

18. An open notch type wedge for bonding a wire to a bond pad that is recessed below the surface of a microelectronic device, said wedge comprising:
   (A) a body having an aperture, said aperture comprising:
      an entrance opening through which said wire enters the body;
      an exit opening at which said wire exits the body;
   (B) a sidewall beneath each side of said exit opening to prevent said wire from moving sideways; and
   (C) a foot having a back radius that extends completely across a width of the wedge, where said foot extends about 0.0004 to about 0.0008 inches beneath said sidewalls, whereby no portion of said wedge contacts said surface during bonding.

19. A wedge according to claim 18 including ultrasonic bonding means for applying ultrasonic bonding energy to said wire.

* * * * *